(12) United States Patent
Takashima et al.

(10) Patent No.: US 7,950,326 B2
(45) Date of Patent: *May 31, 2011

(54) PHOTOGRAVURE PRESS AND METHOD FOR MANUFACTURING MULTILAYER CERAMIC ELECTRONIC COMPONENT

(75) Inventors: Hiroyoshi Takashima, Sabae (JP); Akira Hashimoto, Suzhou (CN); Kazuhiro Tabata, Sabae (JP); Yoshihiro Kanayama, Echizen (JP); Takashige Tanabe, Kusatsu (JP)

(73) Assignee: Murata Manufacturing Co., Ltd., Kytoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/212,017

(22) Filed: Sep. 17, 2008

(65) Prior Publication Data
US 2009/0022882 A1 Jan. 22, 2009

Related U.S. Application Data

(63) Continuation of application No. 11/619,249, filed on Jan. 3, 2007, now Pat. No. 7,481,162, which is a continuation of application No. PCT/JP2005/007889, filed on Apr. 26, 2005.

(30) Foreign Application Priority Data

Jul. 8, 2004 (JP) ................................. 2004-201557

(51) Int. Cl.
*B41F 9/00* (2006.01)
*B41N 1/00* (2006.01)
(52) U.S. Cl. ........................................ 101/150; 101/395
(58) Field of Classification Search .................. 101/150, 101/152–154, 161, 165, 170, 395, 401.1; 430/307, 310, 396
See application file for complete search history.

(56) References Cited

U.S. PATENT DOCUMENTS

| | | | |
|---|---|---|---|
| 3,507,729 A | 4/1970 | Miller | |
| 4,819,558 A | 4/1989 | Counard | |
| 5,033,377 A | 7/1991 | Shimizu | |
| 5,671,678 A | 9/1997 | Bolte et al. | |

(Continued)

FOREIGN PATENT DOCUMENTS

JP 57-012697 * 1/1982

(Continued)

OTHER PUBLICATIONS

Takashima et al.; "Photogravure Press and Method for Manufacturing Multilayer Ceramic Electronic Component"; U.S. Appl. No. 11/619,249, filed Jan. 3, 2007.

(Continued)

*Primary Examiner* — Leslie J Evanisko
*Assistant Examiner* — Marissa L Ferguson-Samreth
(74) *Attorney, Agent, or Firm* — Keating & Bennett, LLP

(57) ABSTRACT

In a print area provided on a peripheral surface of a gravure roll, a plurality of cells are defined by printing-direction walls and perpendicular walls, and each perpendicular wall has a plurality of cuts. In a center portion of the print area, most intersections of the printing-direction walls and the perpendicular walls are defined by T-shaped intersections where the perpendicular walls do not cross the printing-direction walls, but meet the printing-direction walls in a T-shaped arrangement. Preferably, round chamfers are provided at corners where a portion of each printing-direction wall and a portion of each perpendicular wall intersect, and at leading ends of the perpendicular walls pointing toward the cuts.

20 Claims, 7 Drawing Sheets

U.S. PATENT DOCUMENTS

| | | |
|---|---|---|
| 6,680,092 B1 | 1/2004 | Levy |
| 6,701,839 B1 | 3/2004 | Levy |
| 6,731,405 B2 | 5/2004 | Samworth |
| 7,063,014 B2 | 6/2006 | Hashimoto et al. |
| 2003/0111158 A1 | 6/2003 | Okuyama et al. |
| 2004/0221755 A1* | 11/2004 | Hashimoto et al. ........... 101/153 |

FOREIGN PATENT DOCUMENTS

| | | |
|---|---|---|
| JP | 03-108307 A | 5/1991 |
| JP | 5-41015 * | 5/1993 |
| JP | 5-41015 Y2 | 10/1993 |
| JP | 06-316174 A | 11/1994 |
| JP | 09-76459 A | 3/1997 |
| JP | 2001-093779 A | 4/2001 |
| JP | 2003-59750 A | 2/2003 |
| JP | 2003-86451 A | 3/2003 |

OTHER PUBLICATIONS

Official Communication issued in the corresponding Taiwanese Application No. 093110741, Aug. 1, 2005.

Hashimoto et al.; "Photogravure Press and Method for Manufacturing Multilayer-Ceramic Electronic Component"; U.S. Appl. No. 10/826,236, filed Apr. 16, 2004.

Official Communication issued in corresponding Chinese Patent Application No. 200580022634.6, mailed on Mar. 8, 2010.

* cited by examiner

PHOTOGRAVURE PRESS AND METHOD FOR MANUFACTURING MULTILAYER CERAMIC ELECTRONIC COMPONENT

BACKGROUND OF THE INVENTION

1. Field of the Invention

The present invention relates to a photogravure press and a method for manufacturing a multilayer ceramic electronic component performed with the photogravure press, and more particularly, to a technique for enhancing the smoothness of a paste film formed by gravure printing.

2. Description of the Related Art

In order to manufacture a multilayer ceramic electronic component, such as a multilayer ceramic capacitor, for example, a step of forming a conductive paste film defining an internal electrode on a ceramic green sheet is performed. The internal electrode must have high patterning accuracy. As a technique that satisfies this requirement, gravure printing has been used (for example, see Patent Document 1).

Japanese Unexamined Patent Application Publication No. 9-76459 (Patent Document 1) discloses that, of a plurality of cells provided in each print area provided on a peripheral surface of a gravure roll on which printing paste is applied, some cells provided in an outer peripheral portion of the print area have an open area that is smaller than that of the other cells provided in a center portion of the print area and the cells in the outer peripheral portion have a smaller depth than that of the cells in the center portion in order to ensure a uniform thickness of an outer peripheral portion of a paste film formed by gravure printing.

However, since the cells provided in the print area are independent from each other in Patent Document 1, the ratio of the sum of the areas of the cells to the total area of the print area is relatively low, and printing paste does not flow between the adjacent cells during printing. Therefore, this technique is unsuitable particularly for printing for forming a paste film having a relatively large area, and causes uneven printing.

As a technique that overcomes the above-described problems, walls that define a plurality of cells provided in a print area are provided and arranged so as to extend at an angle with respect to the printing direction, and cuts are provided in the walls that define the cells so that the adjacent cells communicate with each other, although this is not intended to be applied to the field of electronic components (for example, see Japanese Examined Utility Model Registration Application Publication No. 5-41015 (Patent Document 2)).

According to the above-described technique disclosed in Patent Document 2, the ratio of the area of a region in which printing paste is received (that is, cells and cuts) to the total area of the print area is increased, and the printing paste flows through the cuts.

However, in the technique disclosed in Patent Document 2, it is essential that a gap of each cut is less than a width of a wall. Therefore, when printing paste having a relatively high viscosity, such as conductive paste, is used, flow of the printing paste between the adjacent cells is limited. As a result, traces of the cells remain in a printed paste film, and a smooth paste film cannot be formed.

Further, in the technique disclosed in Patent Document 2, the walls that define a plurality of cells provided in the print area are arranged so as to extend at an angle relative to the printing direction. Therefore, when a printing sheet is separated from the gravure roll, so-called stringiness of the printing paste occurs at an angle to the printing direction, that is, to the moving direction of the peripheral surface of the gravure roll, and local irregularities are produced in a peripheral portion of the printed paste film.

While the above-described stringiness occurs in a direction at an angle to the printing direction, the direction is not fixed. Therefore, strings of the printing paste at a plurality of locations flow together and are combined. This leads to variations in the thickness of the paste film.

SUMMARY OF THE INVENTION

To overcome the above-described problems, preferred embodiments of the present invention provide a photogravure press and a method for manufacturing a multilayer ceramic electronic component performed with the photogravure press.

Preferred embodiments of the present invention are directed to a photogravure press that forms a paste film on a printing sheet by gravure printing.

The photogravure press includes a gravure roll having a print area which is provided on a peripheral surface thereof and on which printing paste is applied so as to form the paste film.

The photogravure press having this configuration includes the following features in order to overcome the above-described problems.

That is, the print area includes printing-direction walls extending substantially in a printing direction, perpendicular walls extending substantially perpendicularly to the printing-direction walls, and a plurality of cells defined by the printing-direction walls and the perpendicular walls. The perpendicular walls have cuts that enable the cells adjacent in the printing direction to communicate with each other. The printing-direction walls and the perpendicular walls intersect to form intersections, and the intersections include T-shaped intersections where the perpendicular walls do not cross the printing-direction walls, but meet the printing-direction walls in a T-shaped arrangement.

As described above, the printing-direction walls extend substantially in the printing direction, and the perpendicular walls extend substantially perpendicularly to the printing-direction walls. This is because there is a tolerance of approximately +5' in both the printing direction and the perpendicular direction.

Preferably, the above-described T-shaped intersections are distributed at least in a central portion of the print area. In this case, it is preferable that half or more of the intersections provided in the center portion of the print area be the T-shaped intersections. It is most preferable that all the intersections provided in the center portion of the print area be the T-shaped intersections.

Preferably, a round or oblique chamfer is provided at a corner of each of the intersections where a portion of each of the printing-direction walls and a portion of each of the perpendicular walls intersect.

Preferably, a gap of each cut in the center portion of the print area is greater than widths of the printing-direction wall and the perpendicular wall.

Preferably, round or oblique chamfers are provided at leading ends of the perpendicular walls pointing toward the cuts.

Preferably, the printing-direction walls substantially continuously extend from a print start side to a print end side of the print area. Substantially continuous extension of the printing-direction walls means that the printing-direction walls may have a plurality of breaks, or, for example, a groove may be provided at the print start side or the print end side.

Preferably, the cuts adjacent in the printing direction are shifted from each other in the direction that is substantially perpendicular to the printing direction. In this case, it is more preferable that the cuts be provided at two diagonally opposed corners of each of the cells.

Preferably, the photogravure press according to preferred embodiments of the present invention is used particularly to manufacture a multilayer ceramic electronic component. In this case, a patterned layer that defines a portion of a multilayer structure provided in the multilayer ceramic electronic component is the paste film formed by the photogravure press. Therefore, preferred embodiments of the present invention are also directed to a multilayer-ceramic-electronic-component manufacturing method performed with the above-described photogravure press.

In the multilayer-ceramic-electronic-component manufacturing method according to a preferred embodiment of the present invention, gravure printing is preferably used to form a conductive paste film defining an internal electrode. That is, preferably, conductive paste is used as the above-described printing paste, and the paste film formed by the printing paste is a conductive paste film defining an internal electrode.

In the above-described case, the above-described printing sheet is preferably a ceramic green sheet. The printing sheet may be a resin sheet, such as a carrier film.

As described above, with the photogravure press according to preferred embodiments of the present invention, a print area provided on a peripheral surface of a gravure roll includes printing-direction walls and perpendicular walls. The perpendicular walls have cuts that enable the adjacent cells of a plurality of cells defined by the printing-direction walls and the perpendicular walls to communicate with each other. Therefore, for example, even when a conductive paste having a relatively high metal content, and therefore, having a relatively high viscosity is used as printing paste, the printing paste flows between the adjacent cells. As a result, surface irregularities of a paste film formed by gravure printing are reduced, and the thickness of the paste film is made uniform.

Since the printing-direction walls extend substantially in the printing direction, the direction of stringiness of the printing paste caused when the printing sheet is separated from the gravure roll is substantially limited to the printing direction, and is not oblique. This also contributes to uniform thickness of the paste film formed by gravure printing, and avoids local irregularities that can be produced in a peripheral portion of the printed paste film.

The printing-direction walls and the perpendicular walls intersect to form intersections. Since the intersections include T-shaped intersections where the perpendicular walls do not cross the printing-direction walls (that is, do not form cross-shaped intersections), but meet the printing-direction walls in a T-shaped arrangement, the number of intersections in the same area as compared to when only cross-shaped intersections are provided. As a result, the distribution of openings provided by the cells is more uniform. This also contributes to surface smoothness of the paste film formed by gravure printing. This is because it is possible to decrease the possibility that strings produced at a plurality of locations flow together and are combined.

The advantages of the above-described T-shaped intersections are more reliably achieved when the T-shaped intersections are distributed at least in a center portion of the print area. In order to more reliably achieve the advantage of the T-shaped intersections, it is preferable that at least of the intersections provided in the center portion of the print area are defined by the T-shaped intersections. It is most preferable that all of the intersections provided in the center portion of the print area are defined by the T-shaped intersections.

When a round or oblique chamfer is provided at a corner of each intersection where a portion of the printing-direction wall and a portion of the perpendicular wall intersect, the printing paste flows better between the adjacent cells, and the flow of stringiness is produced more smoothly. As a result, this further improves the smoothness of the paste film formed by gravure printing. Also, an advantage of easy cleaning of the print area is achieved.

When a gap of each cut is greater than the widths of the printing-direction walls and the perpendicular walls in the center portion of the print area, the printing paste flows better between the adjacent cells. Therefore, this also enables uniform thickness of the paste film formed by gravure printing.

When round or oblique chamfers are provided at leading ends of the perpendicular walls pointing toward the cuts, the printing paste flows better between the adjacent cells and the flow of stringiness is produced more smoothly, in a manner similar to that in the above-described case when the round or oblique chamfer is provided at the corner where a portion of the printing-direction wall and a portion of the perpendicular wall intersect. As a result, this further improves the smoothness of the paste film formed by gravure printing.

In the photogravure press according to preferred embodiments of the present invention, when the printing-direction walls substantially continuously extend from a print start side to a print end side of the print area, the printing paste flows in the printing direction only within a region surrounded by the printing-direction walls. Therefore, this is highly effective in avoiding surface irregularities of the paste film. Consequently, the thickness of the paste film formed by gravure printing is more reliably uniform.

When the cuts adjacent in the printing direction are shifted from each other in the direction that is substantially perpendicular to the printing direction, more preferably, when the cuts are provided at two diagonally opposed corners of each cell, the printing paste, which should remain in the cell, is advantageously prevented from being undesirably scraped off when an excess of the printing paste on the peripheral surface of the gravure roll is scraped off by a doctor blade, and the paste film is prevented from thereby being partially thinned. When the printing sheet is separated from the gravure roll, stringiness of the printing paste continuously proceeds through the cuts. Therefore, when the adjacent cuts are shifted from each other in the direction that is substantially perpendicular to the printing direction, as described above, surface irregularities of the paste film that can be produced by stringiness of the printing paste are prevented.

Accordingly, when the above-described photogravure press is used to manufacturing of a multilayer ceramic electronic component, the characteristics of the obtained multilayer ceramic electronic component are stabilized, the occurrence of defectives are prevented, and the manufacturing yield is increased.

In particular, when a conductive paste film defining an internal electrode provided in the multilayer ceramic electronic component is formed by the photogravure press of preferred embodiments of the present invention, the thickness of the conductive paste film is made uniform. Therefore, it is possible to prevent a short circuit and an insulation resistance failure in the obtained multilayer ceramic electronic component.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
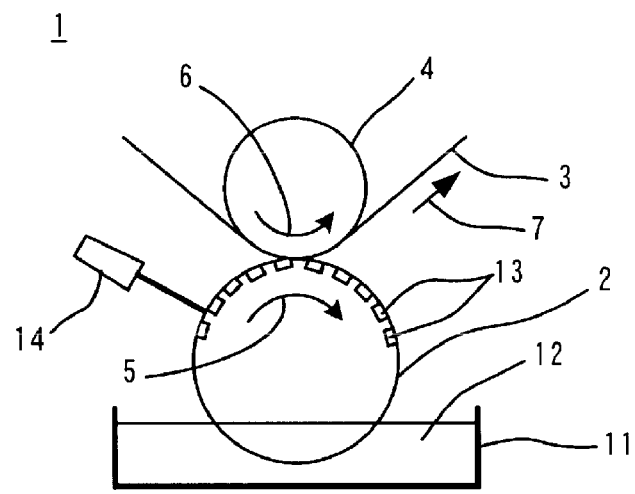
FIG. 1 is a front view schematically showing a photogravure press 1 according to a first preferred embodiment of the present invention.

FIG. 1 is a front view schematically showing a photogravure press 1 according to a first preferred embodiment of the present invention.

The photogravure press 1 preferably includes a gravure roll 2, and an impression cylinder 4 facing the gravure roll 2 with a printing sheet 3 disposed therebetween. The gravure roll 2 and the impression cylinder 4 rotate in the directions of arrows 5 and 6, respectively, whereby the printing sheet 3 is conveyed in the direction of arrow 7. Incidentally, there are photogravure presses that do not include an impression cylinder, for example, a photogravure offset press.

The photogravure press 1 is used to manufacture a multilayer ceramic electronic component, such as a multilayer ceramic capacitor, for example. More particularly, the photogravure press 1 is used to form paste films, which are to be patterned layers defining a portion of a multilayer structure provided in the multilayer ceramic electronic component, on the printing sheet 3 by gravure printing. More specifically, as shown in FIG. 2, patterned conductive paste films 9 defining internal electrodes are formed on a ceramic green sheet 8 by gravure printing.

Figure 2:
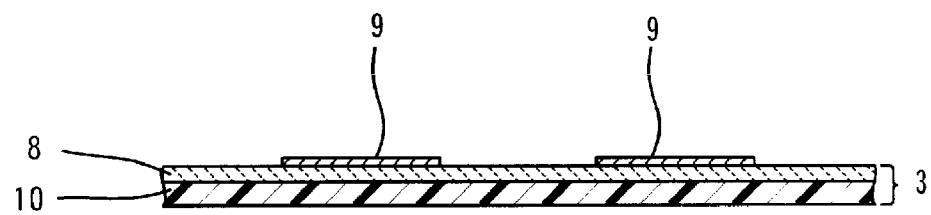
FIG. 2 is a cross-sectional view showing a state in which conductive paste films are formed on a ceramic green sheet by the photogravure press shown in FIG. 1. A printing sheet is formed of the ceramic green sheet lined with a carrier film.

The ceramic green sheet 8 is lined with a carrier film 10, as shown in FIG. 2. Therefore, the printing sheet 3 shown in FIG. 1 is formed of the ceramic green sheet 8 that is lined with the carrier film 10.

As shown in FIG. 1, the gravure roll 2 is immersed in conductive paste 12 provided in a tank 11, so that the conductive paste 12 is applied on a plurality of print areas 13 (some of them are schematically shown in the figure) provided on a peripheral surface of the gravure roll 2. The print areas 13 will be described in detail below. The conductive paste 12 may be supplied to the gravure roll 2, for example, by being injected toward the gravure roll 2. An excess of the conductive paste 12 on the peripheral surface of the gravure roll 2 is scraped off by a doctor blade 14.

Figure 3:
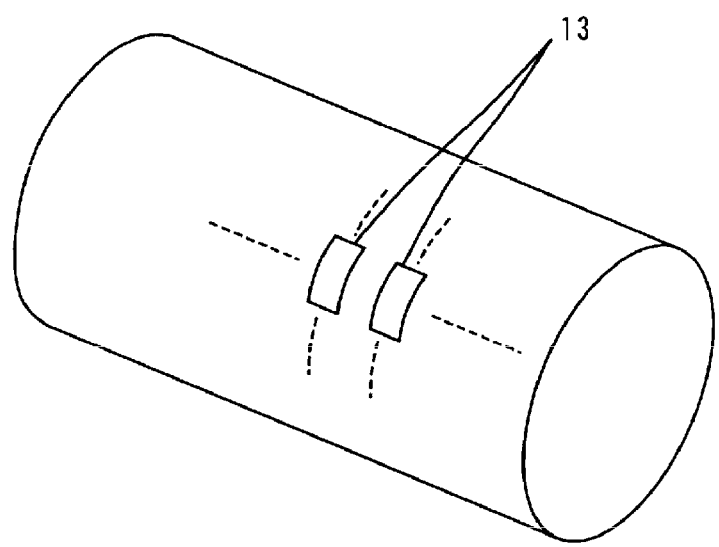
FIG. 3 is a perspective view showing a gravure roll alone shown in FIG. 1.

The print areas 13 have a pattern corresponding to a pattern of the conductive paste films 9 shown in FIG. 2, and only representative examples of the print areas 13 are schematically shown in FIG. 3. In this preferred embodiment, the longitudinal direction of the print areas 13 extends in the circumferential direction of the gravure roll 2.

Figure 4:
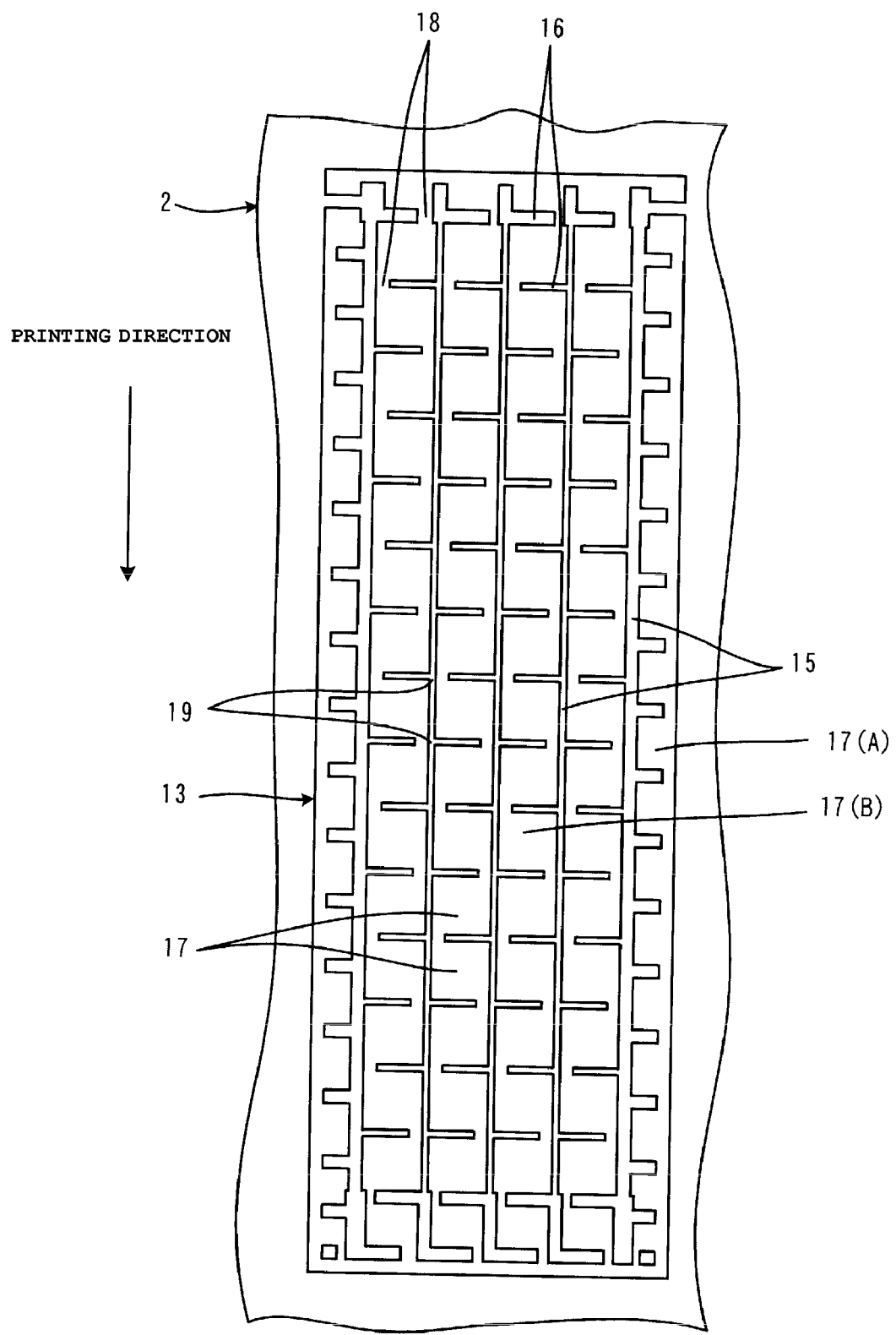
FIG. 4 is a developed view of a peripheral surface of the gravure roll, illustrating one print area shown in FIG. 3 in an enlarged size.

FIG. 4 is a view of the peripheral surface of the gravure roll 2, illustrating one of the print areas 13 in an enlarged size. The printing direction is shown by the arrow in FIG. 4, and corresponds to the direction of arrow 5 in FIG. 1. More specifically, an upper end and a lower end of the print area 13 in FIG. 4 define a print start side and a print end side, respectively. Therefore, during a printing process, a region of the print area 13 that comes into contact with the printing sheet 3 is shifted from the upper end to the lower end in FIG. 4.

The print area 13 includes a plurality of printing-direction walls 15 extending in the printing direction, and a plurality of perpendicular walls 16 extending substantially perpendicularly to the printing-direction walls 15. The print area 13 also includes a plurality of cells 17 defined by the printing-direction walls 15 and the perpendicular walls 16.

The respective open areas of these cells 17 will be viewed. Cells 17(A) lying in a peripheral portion of the print area 13 are smaller than cells 17(B) lying in a center portion of the print area 13. In order to make the open areas of the cells 17(A) lying in the peripheral portion smaller, the widths of the printing-direction walls 15 and the perpendicular walls 16 lying in the peripheral portion of the print area 13 are greater than in the other portions. This structure reduces the occurrence of a so-called saddle phenomenon that will be described below.

In general, when a paste film is formed by gravure printing, a so-called saddle phenomenon, in which the thickness of the paste film is greater in a peripheral portion thereof than in a center portion, often occurs. When a multilayer ceramic electronic component is manufactured with this conductive paste film subjected to the saddle phenomenon, a short circuit or a structural defect tends to occur. The above-described structure effectively suppresses this saddle phenomenon.

Figure 5:
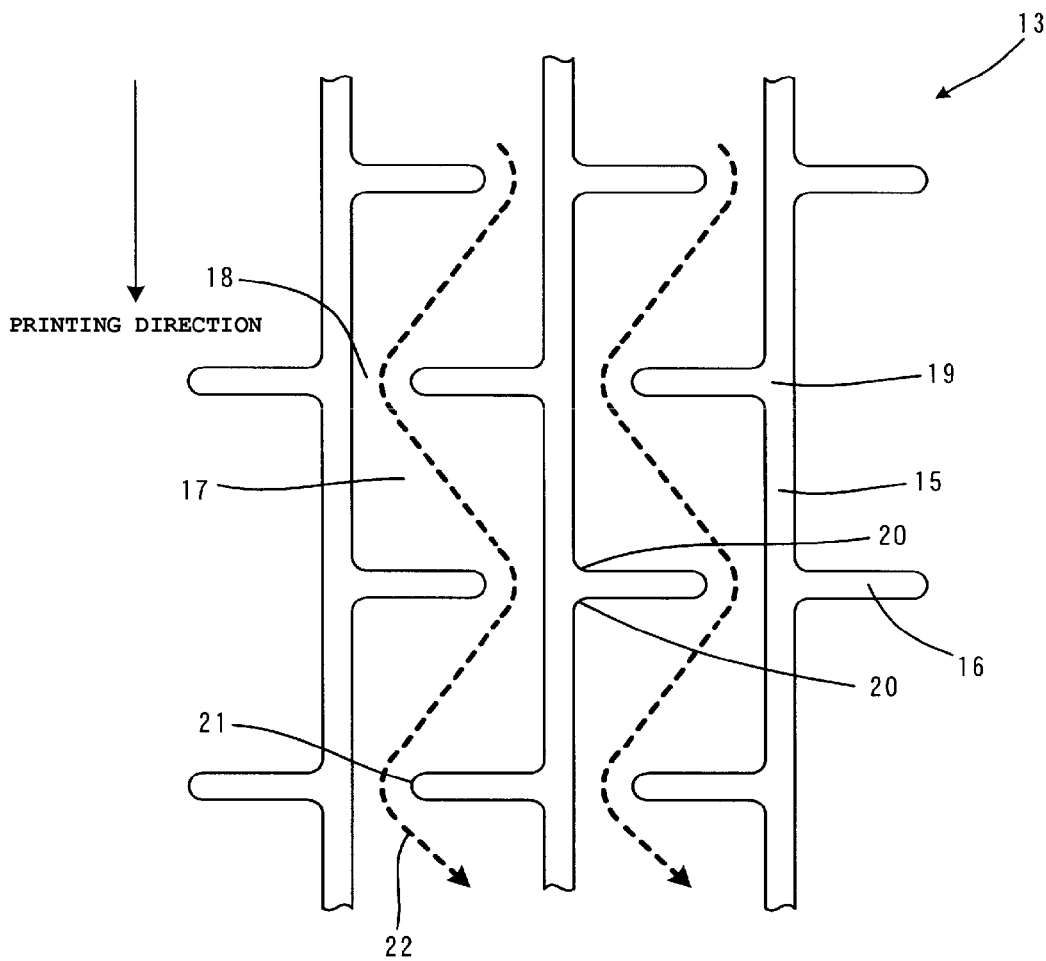
FIG. 5 is a further enlarged view of a portion of the print area shown in FIG. 4.

FIG. 5 is a further enlarged view of a portion of the print area 13 shown in FIG. 4.

As shown in FIGS. 4 and 5, the perpendicular walls 16 have cuts 18, and this enables the cells 17 adjacent in the printing direction to communicate with each other. In this preferred embodiment, the perpendicular walls 16 intermittently extend with the cuts 18 provided in the direction substantially perpendicular to the printing direction.

The printing-direction walls 15 and the perpendicular walls 16 define intersections. In this preferred embodiment, the intersections form T-shaped intersections 19 where the perpendicular walls 16 do not cross the printing-direction walls 15, but instead, meet the printing-direction walls 15 in a T-shaped arrangement. Further, all of the intersections in this preferred embodiment are T-shaped intersections 19.

As shown in FIG. 5, round chamfers 20 are provided at corners of each T-shaped intersection 19 where a portion of the printing-direction wall 15 and a portion of the perpendicular wall 16 intersect. A round chamfer 21 is also provided at a leading end of the perpendicular wall 16 pointing toward the cut 18.

Although not provided in this preferred embodiment, even when the perpendicular walls 16 extend through the printing-direction walls 15 to form cross-shaped intersections, it is preferable to provide the chamfering described above.

As shown in FIGS. 4 and 5, a gap of the cut 18 in the center portion of the print area 13 is greater than the width of the printing-direction walls 15 and the perpendicular walls 16. For example, while the width of the printing-direction walls 15 and the perpendicular walls 16 is in the range of about 5 μm to about 20 μm, a gap of the cut 18 is in the range of about 20 μm to about 40 μm.

With this structure, even a conductive paste 12 (see FIG. 1) having a viscosity greater than that of general gravure ink, for example, a viscosity of about 0.1 Pa·s to about 40 Pa·s, it consistently and smoothly flows in the printing direction, and surface smoothness and uniform thickness is reliably obtained in the conductive paste films 9.

As shown in FIG. 4, the printing-direction walls 15 substantially continuously extend from the print start side to the print end side of the print area 13.

Since this structure enables the conductive paste 12 to flow smoothly between the adjacent cells 17, the conductive paste 12 uniformly flows in the printing direction. Further, when the printing sheet 3 is separated from the gravure roll 2, so-called stringiness of the conductive paste 12 occurs while being regulated in the printing direction, but does not occur obliquely, as shown by broken arrows 22 in FIG. 5. This prevents local irregularities in the peripheral portions of the printed conductive paste films 9 (see FIG. 2).

The cuts 18 adjacent in the printing direction are spaced from each other in the direction that is substantially perpendicular to the printing direction. In particular, the cuts 18 are located at two diagonally opposed corners of each cell 17 in this preferred embodiment.

This structure advantageously prevents the conductive paste 12, which should remain in the cells 17, from being undesirably scraped off when an excess of the conductive paste 12 on the peripheral surface of the gravure roll 2 is scraped off by the doctor blade 14, and prevents the conductive paste films 9 from thereby being partially thinned.

When the printing sheet 3 is separated from the gravure roll 2, stringiness of the conductive paste 12 continuously proceeds through the cuts 18. Therefore, when the adjacent cuts 18 are shifted in the direction that is substantially perpendicular to the printing direction, as described above, surface irregularities of the conductive paste films 9 that may be produced by stringiness of the conductive paste 12 are reduced.

By forming the conductive paste film 9 with the photogravure press 1 having the above-described configuration, the entire surface of conductive paste film 9 is smooth, and the outline thereof has outstanding linearity.

After the ceramic green sheet 8 provided with the conductive paste 9 shown in FIG. 2 is obtained by the photogravure press 1, a plurality of ceramic green sheets 8 are stacked and bonded by pressure, cut as necessary, and then fired, whereby a multilayer structure defining a main body of a multilayer ceramic electronic component is obtained. In this multilayer structure, the above-described conductive paste films 9 define internal electrodes. Subsequently, an external electrode and other suitable components are formed on an outer surface of the multilayer structure, as necessary, thus completing a desired multilayer ceramic electronic component.

In the multilayer ceramic electronic component, since the entirely smooth conductive paste films 9 are formed, as described above, stress is not locally concentrated during the pressure bonding step. For this reason, a short circuit in which the internal electrodes contact each other through the ceramic layer and an insulation resistance failure due to local thinning of the ceramic layer are prevented.

Figure 6:
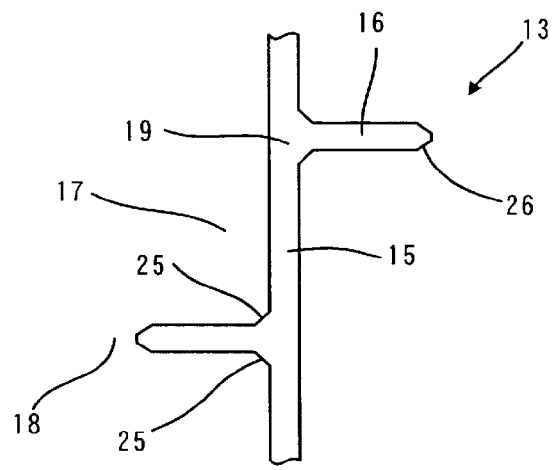
FIG. 6 is an explanatory view of a second preferred embodiment of the present invention, corresponding to a part of FIG. 5.

FIG. 6 is an explanatory view of a second preferred embodiment of the present invention, corresponding to a portion of FIG. 5. In FIG. 6, elements corresponding to the elements shown in FIG. 5 are denoted by the same reference numerals, and the descriptions thereof are omitted.

In the second preferred embodiment shown in FIG. 6, oblique chamfers 25 are provided at corners of each T-shaped intersection 19 where a portion of a printing-direction wall 15 and a portion of a perpendicular wall 16 intersect, and the oblique chamfers 26 are provided at a leading end of the perpendicular wall 16 pointing toward a cut 18. These oblique chamfers 25 and 26 provide a function similar to that of the round chamfers 20 and 21 in the first preferred embodiment of the present invention.

Figure 7:
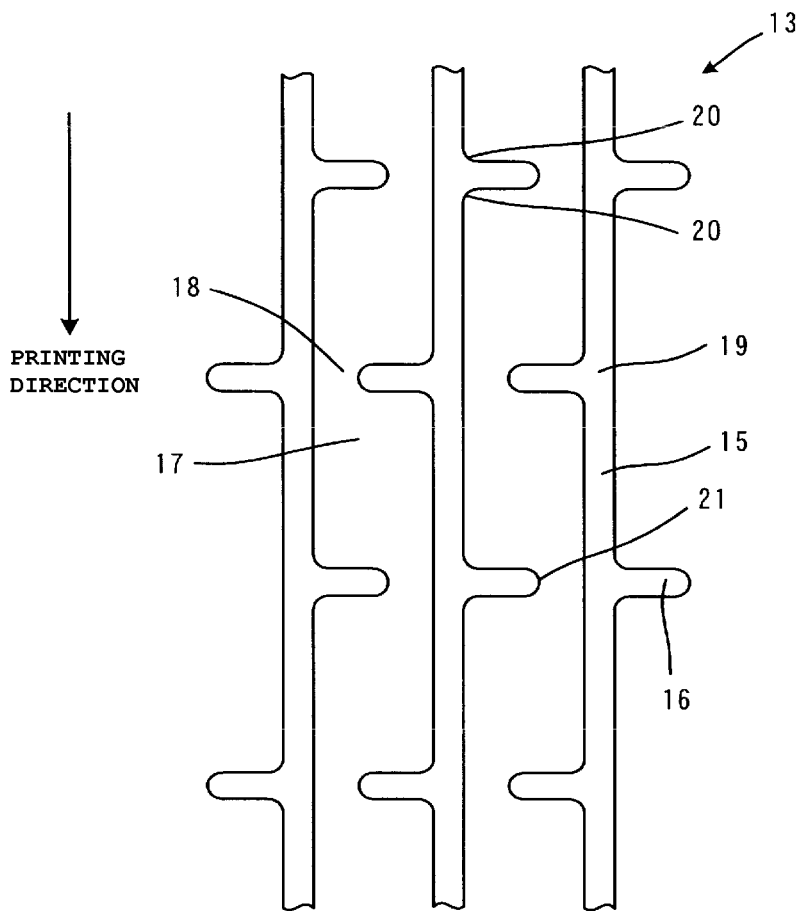
FIG. 7 is an explanatory view of a third preferred embodiment of the present invention, corresponding to FIG. 5.
Figure 8:
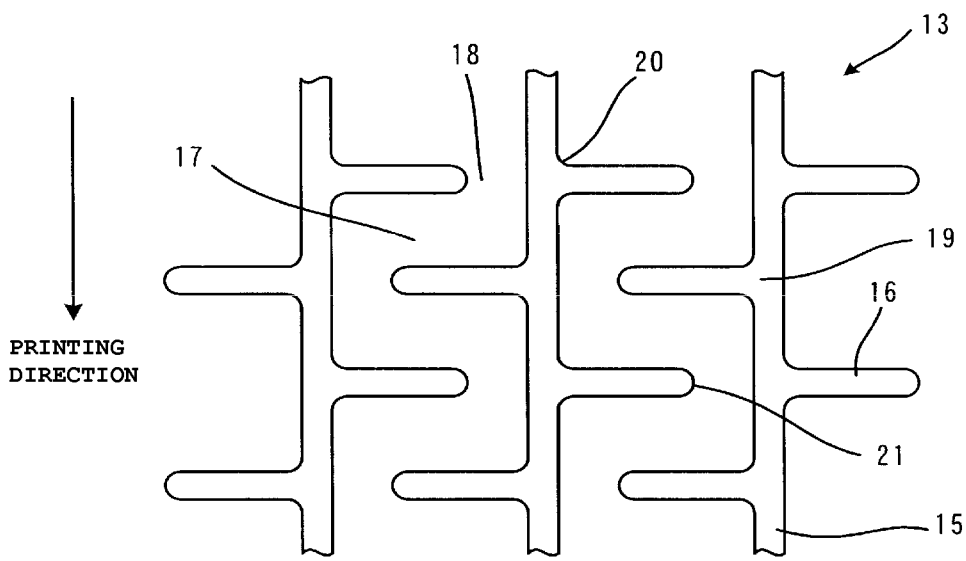
FIG. 8 is an explanatory view of a fourth preferred embodiment of the present invention, corresponding to FIG. 5.

FIGS. 7 and 8 are explanatory views of third and fourth preferred embodiments of the present invention, corresponding to FIG. 5. In FIGS. 7 and 8, elements corresponding to the elements shown in FIG. 5 are denoted by the same reference numerals, and the descriptions thereof are omitted.

While the cells 17 are substantially square in plan view in the first preferred embodiment shown in FIG. 5, cells 17 in the third preferred embodiment shown in FIG. 7 have a substantially rectangular shape that is longer in the printing direction in plan view, and cells 17 in the fourth preferred embodiment shown in FIG. 8 have a substantially rectangular shape that is longer in the direction that is substantially perpendicular to the printing direction in plan view. Except for these planar shapes of the cells 17, the third and fourth preferred embodiments have characteristics similar to those in the first preferred embodiment.

Figure 9:
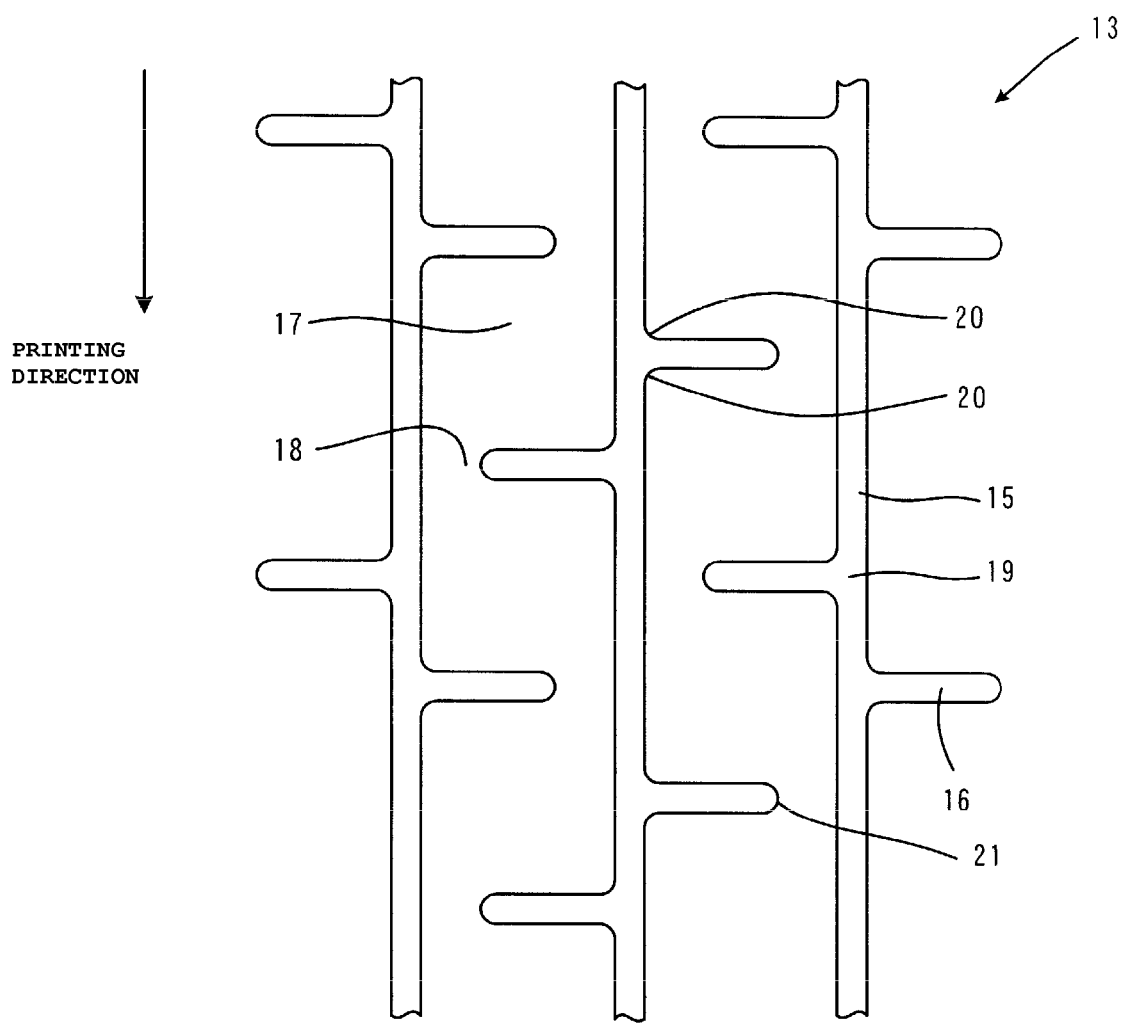
FIG. 9 is an explanatory view of a fifth preferred embodiment of the present invention, corresponding to FIG. 5.

FIG. 9 is an explanatory view of a fifth preferred embodiment of the present invention, corresponding to FIG. 5. In FIG. 9, element corresponding to the elements shown in FIG. 5 are denoted by the same reference numerals, and the descriptions thereof are omitted.

In contrast to the first preferred embodiment, the fifth preferred embodiment shown in FIG. 9 maintains the characteristic that T-shaped intersections 19. However, the locations of the perpendicular walls 16 in the printing direction are changed. As a result, cells are not necessarily aligned in the direction that is substantially perpendicular to the printing direction. The fifth preferred embodiment also has the other characteristics of the first preferred embodiment.

Figure 10:
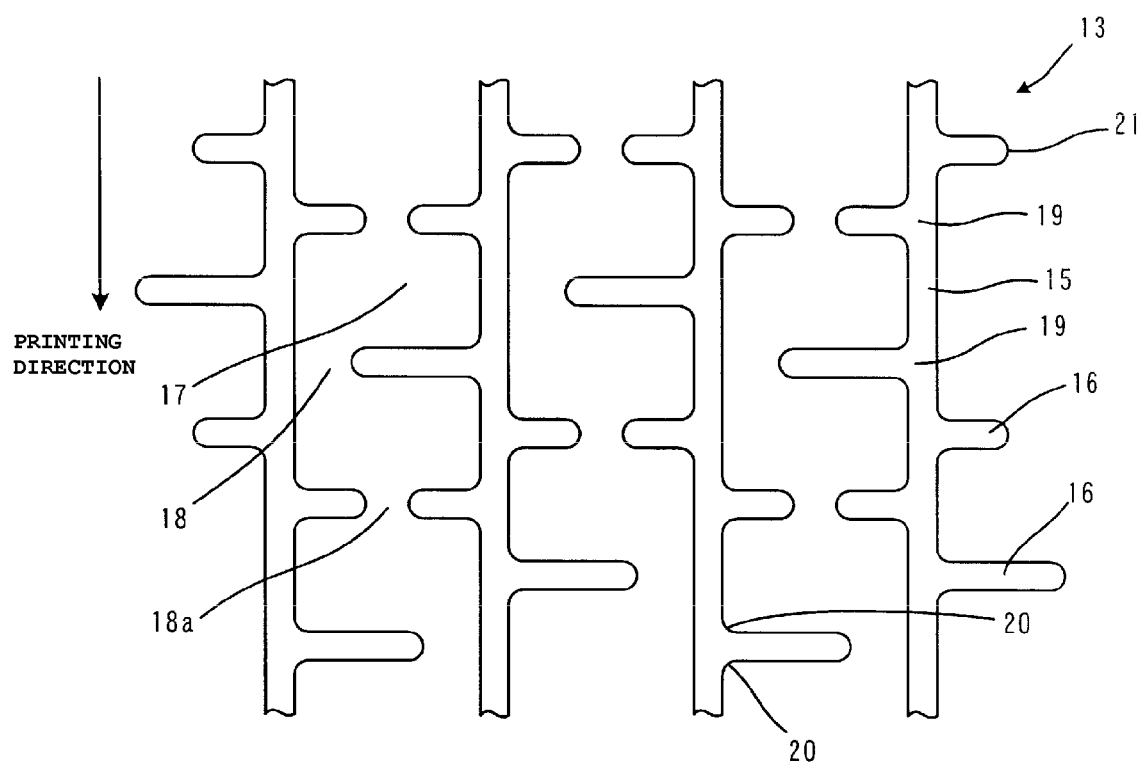
FIG. 10 is an explanatory view of a sixth preferred embodiment of the present invention, corresponding to FIG. 5.

FIG. 10 is an explanatory view of a sixth preferred embodiment of the present invention, corresponding to FIG. 5. In FIG. 10, elements corresponding to the elements shown in FIG. 5 are denoted by the same reference numerals, and the descriptions thereof are omitted.

In the sixth preferred embodiment shown in FIG. 10, similar to the fifth preferred embodiment, cells 17 are not aligned in the direction that is substantially perpendicular to the printing direction, but are arranged in a zigzag pattern.

In the sixth preferred embodiment, cuts provided in perpendicular walls 16 include not only cuts 18 that are provided between one-side ends of the perpendicular walls 16 and printing-direction walls 15, but also cuts 18 a provided at the midpoints between the adjacent printing-direction walls 15.

The sixth preferred embodiment also has the other characteristics of the first preferred embodiment of the present invention.

Figure 11:
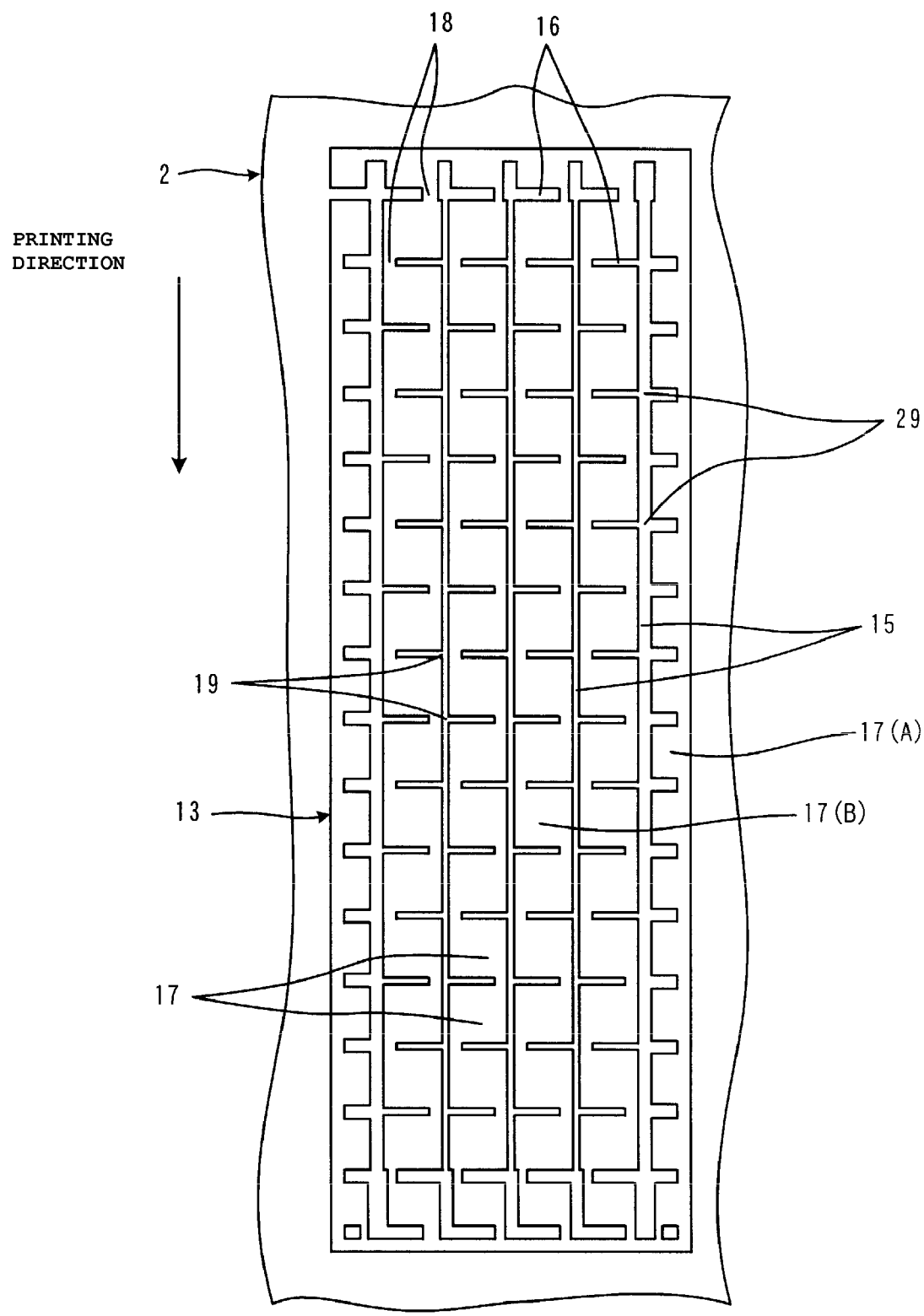
FIG. 11 is an explanatory view of a seventh preferred embodiment of the present invention, corresponding to FIG. 4.

FIG. 11 is an explanatory view of a seventh preferred embodiment of the present invention, corresponding to FIG. 4. In FIG. 11, elements corresponding to the elements shown in FIG. 4 are denoted by the same reference numerals, and the descriptions thereof are omitted.

In the seventh preferred embodiment shown in FIG. 11, all of the intersections provided in a center portion of a print area 13 are preferably T-shaped, however, some of intersections provided in a peripheral portion of the print area 13 are cross-shaped intersections 29. This illustrates that it is important to provide the T-shaped intersections 19 in the center portion of the print area 13.

While it is most preferable that all the intersections in the center portion of the print area 13 be the T-shaped intersections 19, some of the intersection may be cross-shaped intersections. When the T-shaped intersections and the cross-shaped intersections are both provided, it is preferable that at least half of the intersections are T-shaped.

The above-described seventh preferred embodiment also has characteristics similar to the other characteristics of the first preferred embodiment of the present invention.

While the present invention has been described above in conjunction with the illustrated preferred embodiments, other modifications are possible within the scope of the invention.

For example, while the print areas 13 are substantially rectangular in the illustrated preferred embodiments, the shape of the print areas 13 may be arbitrarily changed in accordance with the patterns of the conductive paste films 9 to be formed by gravure printing.

While the printing sheet 3 is formed of the ceramic green sheet 8 lined with the carrier film 10 and the conductive paste films 9 are formed on the ceramic green sheet 8 in the preferred embodiments, for example, only a resin sheet, such as the carrier film 10, may be used as the printing sheet 3, and the conductive paste film 9 may be formed on the resin sheet. In this case, the conductive paste films 9 formed on the resin sheet are transferred onto the ceramic green sheet 8 in a later step.

While the paste films formed by gravure printing are formed of the conductive paste films 9 in the preferred embodiments, they may be formed films made of paste, such as ceramic slurry. More specifically, for example, in order to absorb steps due to the thickness of internal electrodes in a multilayer ceramic capacitor, a ceramic layer for absorbing the steps is sometimes provided in a region where the internal electrodes are not provided. The present invention is also applicable to this case in which a paste film of ceramic slurry is formed as such a ceramic layer.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A photogravure press for use in forming a paste film on a printing sheet by gravure printing, the photogravure press comprising:
   a gravure roll having a print area which is provided on a peripheral surface thereof and on which printing paste is applied so as to apply the paste film; wherein
   the print area includes printing-direction walls extending substantially in a printing direction, perpendicular walls extending substantially perpendicularly to the printing-direction walls, and a plurality of cells defined by the printing-direction walls and the perpendicular walls;
   the perpendicular walls include cuts that enable adjacent ones of the cells in the printing direction to communicate with each other;
   the printing-direction walls and the perpendicular walls intersect to define intersections, and the intersections include T-shaped intersections where the perpendicular walls do not cross the printing-direction walls, but meet the printing-direction walls in a T-shaped arrangement.

2. The photogravure press according to claim 1, wherein the T-shaped intersections are provided at least in a central portion of the print area.

3. The photogravure press according to claim 2, wherein at least half of the intersections provided in the center portion of the print area are the T-shaped intersections.

4. The photogravure press according to claim 1, wherein one of a round chamfer and an oblique chamfer is provided at a corner of each of the intersections at which a portion of each of the printing-direction walls and a portion of each of the perpendicular walls intersect.

5. The photogravure press according to claim 1, wherein a gap of each cut in a center portion of the print area is greater than widths of the printing-direction wall and the perpendicular wall.

6. The photogravure press according to claim 1, wherein one of a round chamfer and an oblique chamfer is provided at each leading end of the perpendicular walls pointing toward the cuts.

7. The photogravure press according to claim 1, wherein the printing-direction walls extend substantially continuously from a print start side to a print end side of the print area.

8. The photogravure press according to claim 1, wherein the cuts adjacent in the printing direction are spaced from each other in a direction that is substantially perpendicular to the printing direction.

9. The photogravure press according to claim 8, wherein the cuts are provided at two diagonally opposed corners of each of the cells.

10. The photogravure press according to claim 1, wherein the photogravure press is used to manufacture a multilayer ceramic electronic component, and the paste film is configured to be a patterned layer that defines a portion of a multilayer structure provided in the multilayer ceramic electronic component.

11. A multilayer ceramic electronic component manufacturing method comprising the steps of:
   providing the photogravure press according to claim 1;
   printing patterned conductive paste films defining internal electrodes on a printing sheet.

12. The multilayer-ceramic-electronic-component manufacturing method according to claim 11, wherein the printing sheet is a resin sheet.

13. The photogravure press according to claim 1, wherein the printing sheet is a ceramic green sheet.

14. A gravure roll provided in a photogravure press that forms a paste film on a printing sheet by gravure printing, the gravure roll comprising:
   a print area provided on a peripheral surface thereof and on which printing paste is applied so as to apply the paste film; wherein
   the print area includes printing-direction walls extending substantially in a printing direction, perpendicular walls extending substantially perpendicularly to the printing-direction walls, and a plurality of cells defined by the printing-direction walls and the perpendicular walls;
   the perpendicular walls include cuts that enable the adjacent ones of the cells in the printing direction to communicate with each other; and
   the printing-direction walls and the perpendicular walls intersect to define intersections, and the intersections include T-shaped intersections where the perpendicular walls do not cross the printing-direction walls, but meet the printing-direction walls in a T-shaped arrangement.

15. A photogravure roll provided in a photogravure press that forms a paste film on a printing sheet by photogravure printing, the photogravure roll comprising:
  a print area provided on a peripheral surface thereof and on which printing paste is applied so as to apply the paste film; wherein
  the print area includes printing-direction walls extending substantially in a printing direction, perpendicular walls extending substantially perpendicularly to the printing-direction walls, and a plurality of cells defined by the printing-direction walls and the perpendicular walls;
  the printing-direction walls of cells adjacent in the printing direction extend substantially continuously at locations where the perpendicular wall is provided; and
  the printing paste is one of a conductive paste and a ceramic paste.

16. A photogravure press for use in forming a paste film on a printing sheet by gravure printing, the photogravure press comprising:
  a gravure roll having a print area provided on a peripheral surface thereof and on which printing paste is applied so as to apply the paste film; wherein
  the print area includes printing-direction walls extending substantially in a printing direction, perpendicular walls extending substantially perpendicularly to the printing-direction walls, and a plurality of cells defined by the printing-direction walls and the perpendicular walls;
  the printing-direction walls of the cells adjacent in the printing direction extend substantially continuously at locations where the perpendicular wall is provided; and
  the printing paste is one of a conductive paste and a ceramic paste.

17. A ceramic electronic component manufacturing method comprising the steps of:
  providing the photogravure press according to claim 16;
  printing patterned paste films on a printing sheet.

18. A photogravure roll provided in a photogravure press that forms a paste film on a printing sheet by photogravure printing, the photogravure roll comprising:
  a print area provided on a peripheral surface thereof and on which printing paste is applied so as to apply the paste film; wherein
  the print area includes printing-direction walls extending substantially in a printing direction, perpendicular walls extending substantially perpendicularly to the printing-direction walls, and a plurality of cells defined by the printing-direction walls and the perpendicular walls;
  the perpendicular walls include cuts that enable adjacent ones of the cells in the printing direction to communicate with each other;
  a gap of each cut is greater than widths of the printing-direction wall and the perpendicular wall; and
  the printing paste is one of a conductive paste and a ceramic paste.

19. A photogravure press for use in forming a paste film on a printing sheet by gravure printing, the photogravure press comprising:
  a gravure roll having a print area provided on a peripheral surface thereof and on which printing paste is applied so as to apply the paste film; wherein
  the print area includes printing-direction walls extending substantially in a printing direction, perpendicular walls extending substantially perpendicularly to the printing-direction walls, and a plurality of cells defined by the printing-direction walls and the perpendicular walls;
  the perpendicular walls include cuts that enable adjacent ones of the cells in the printing direction to communicate with each other;
  a gap of each cut is greater than widths of the printing-direction wall and the perpendicular wall; and
  the printing paste is one of a conductive paste and a ceramic paste.

20. A ceramic electronic component manufacturing method comprising the steps of:
  providing the photogravure press according to claim 19;
  printing patterned paste films on a printing sheet.

* * * * *